(12) United States Patent
Chui et al.

(10) Patent No.: US 7,893,716 B1
(45) Date of Patent: Feb. 22, 2011

(54) HOTSOCKET DETECTION CIRCUITRY

(75) Inventors: Jack Chui, Fremont, CA (US); Toan D. Do, San Jose, CA (US); Kok Siong Tee, Gelugor (MY)

(73) Assignee: Altera Corporation, San Jose, CA (US)

( * ) Notice: Subject to any disclaimer, the term of this patent is extended or adjusted under 35 U.S.C. 154(b) by 857 days.

(21) Appl. No.: 11/801,864

(22) Filed: May 11, 2007

(51) Int. Cl.
*H03K 19/0175* (2006.01)
(52) U.S. Cl. ............................... 326/82; 326/38; 326/81
(58) Field of Classification Search ............. 326/55–58, 326/81–83, 86–87, 112, 119, 121, 38–47; 327/408–411, 540–543, 535; 710/301–302
See application file for complete search history.

(56) References Cited

U.S. PATENT DOCUMENTS

| | | | |
|---|---|---|---|
| 5,408,435 A * | 4/1995 | McClure et al. ............. | 365/201 |
| 6,040,712 A | 3/2000 | Mejia et al. | |
| 6,630,844 B1 | 10/2003 | Chong et al. | |
| 6,670,676 B1 | 12/2003 | Rahim | |
| 6,972,593 B1 | 12/2005 | Wang et al. | |
| 7,085,870 B2 | 8/2006 | Do | |
| 7,119,579 B2 * | 10/2006 | Chong et al. ................. | 326/82 |

OTHER PUBLICATIONS

"Cyclone II Device Handbook, vol. 1," Handbook of Altera Corporation of San Jose, CA pp. 4-1 to 4-6 (Feb. 2007).

* cited by examiner

*Primary Examiner*—James H. Cho
*Assistant Examiner*—Christopher Lo
(74) *Attorney, Agent, or Firm*—Treyz Law Group; G. Victor Treyz; David C. Kellogg

(57) ABSTRACT

Hotsocket detection circuitry is provided for detecting hotsocket conditions in integrated circuits such as programmable logic device integrated circuits. Power-on-reset circuitry may provide a power-on-reset signal that is indicative of when power supply voltages are ready to power circuitry on the integrated circuit for normal operation. A delay circuit that is powered by a power supply voltage may receive the power-on-reset signal and may generate a corresponding delayed version of the power-on-reset signal. The delayed version of the power-on-reset signal may be provided to the hotsocket detection circuitry to ensure that the hotsocket detection circuitry produces a hotsocket signal that transitions after a transition in the power-on-reset signal. The delay circuit may include one or more inverter stages.

20 Claims, 8 Drawing Sheets

| $V_{CCIO}$ | $V_{CCINT}$ | $V_{PIN}$ | NODE A | NODE B | HOTSOCKET |
|---|---|---|---|---|---|
| READY | READY | X | 0 | 0 | 0 |
| NOT READY | READY | 0 | 1 | 0 | 1 ($V_{CCIO}$) |
| READY | NOT READY | X | 0 | 1 | 1 ($V_{CCIO}$) |
| NOT READY | NOT READY | 0 | SYSTEM NOT POWERED | | |
| NOT READY | READY | >$V_{CCIO}$ | 1 | 0 | 1 ($V_{PIN}$) |
| NOT READY | READY | <$V_{CCIO}$ | 1 | 0 | 1 ($V_{CCIO}$) |

HOTSOCKET DETECTION CIRCUITRY

BACKGROUND

This invention relates to hotsocket detection circuitry, and more particularly, to hotsocket detection circuitry for integrated circuits such as programmable logic device integrated circuits.

Integrated circuits such as programmable logic devices have data pins and power pins. The data pins are coupled to input-output circuits that are typically located around the periphery of a chip. Data pins are used to convey data signals to and from the input-output circuits. The power pins on an integrated circuit chip are used to supply power supply voltages to core logic on the chip and to the input-output circuits.

The pins on an integrated circuit are often used to form communications ports. Commonly-used ports include ports that support standards such as the universal serial bus (USB) standard, the Firewire standard (IEEE 1394), etc. Electronic components that use these ports are often designed to be hot swappable. A hot-swappable component can be inserted into a system or removed from a system without powering down the system.

When a hot-swappable peripheral is connected to a powered port, it is not known in advance which pins in the port will be the first to make electrical contact with each other. If a user inserts a peripheral in one way, the power pins in the port may be the first to be electrically connected with each other. If, however, the user inserts the peripheral in a slightly different way, the data pins may be the first to make electrical contact with each other. This type of uncertainty about the order in which the data and power pins are connected must be taken into account when designing integrated circuits for hot swappable applications. For example, such circuits should be designed to avoid circuit failures in situations in which the data pins of the integrated circuit receive signals before the power supply pins have received power and before the circuits of the integrated circuit have had an opportunity to be properly powered up and establish normal operating conditions.

To provide tolerance to hot swapping, integrated circuits such as programmable logic devices may be provided with hotsocket detection circuitry. The hotsocket detection circuitry turns off output buffers within the input-output circuitry during power-up and power-down operations. This ensures that the input-output circuits are not powered up until the core logic is ready for normal operation.

Power-on-reset circuitry can be used to control the operation of the core logic. The power-on-reset circuitry monitors the power supply voltages that are received through the input-output pins. When the power supply voltages reach their normal operating levels, the power-on-reset circuitry generates an appropriate power-on-reset signal. The core logic can be allowed to operate normally upon receiving this power-on-reset signal.

Once the core logic is operating normally and the power supply voltages are fully powered, the hotsocket detection circuitry can produce a hotsocket signal that enables the output buffers and allows the input-output circuitry to function normally.

Due to fabrication process variations, the transistors in the power-on-reset circuitry and hotsocket detection circuitry on an integrated circuit may exhibit performance fluctuations. It may be desirable to minimize performance fluctuations in the power-on-reset circuitry using a process-tolerant design. However, the use of conventional hotsocket detection circuitry in integrated circuit environments that have process-tolerant power-on-reset circuitry may lead to undesirable situations in which the hotsocket detection circuitry enables the input-output circuitry before the power-on-reset circuitry enables the core logic. This can lead to circuit damage or signal corruption.

It would therefore be desirable to be able to provide improved hotsocket detection circuitry for use on integrated circuits such as programmable logic devices.

SUMMARY

In accordance with the present invention integrated circuits such as programmable logic device integrated circuits are provided that include hotsocket detection circuitry. The integrated circuits may include input-output pins including data pins and power pins. When the data pins are powered before the power pins, the integrated circuit experiences a hotsocket condition. In this situation, it may be desirable to disable input-output circuitry on the integrated circuit to prevent circuit damage. The hotsocket detection circuitry may be used to generate a hotsocket signal that is indicative of the presence of a hotsocket condition. The hotsocket signal may be used to disable input-output circuitry such as output buffer circuitry.

The integrated circuit may include power-on-reset circuitry that monitors power supply voltages from the power pins. The power-on-reset circuitry may generate a power-on-reset signal. When one or more of the power supply voltages are below their desired operating levels, the power-on-reset signal may be held high. When the power supply signals are all ready to power circuitry on the integrated circuit in normal operation, the power-on-reset signal may be taken low.

The hotsocket generation circuitry may include a delay circuit. The delay circuit may be based on one or more inverter stages that are powered by one of the power supply voltages on the integrated circuit. The delay circuit may have an input that receives the power-on-reset signal and an output at which a delayed version of the power-on-reset signal is provided. The delay circuit may be used to impose a delay on the power-on-reset signal to ensure that the hotsocket signal does not transition before the power-on-reset signal transitions, thereby preventing circuit damage.

Further features of the invention, its nature and various advantages will be more apparent from the accompanying drawings and the following detailed description of the preferred embodiments.

BRIEF DESCRIPTION OF THE DRAWINGS

FIG. 8 is a table setting forth how hotsocket detector circuitry of the type shown in FIG. 5 may operate on an integrated circuit such as a programmable logic device integrated circuit in accordance with an embodiment of the present invention.

DETAILED DESCRIPTION

The present invention relates to ways in which to provide hotsocket detection capabilities to integrated circuits. The invention applies to any suitable integrated circuits such as digital signal processors, microprocessors, application-specific integrated circuits, etc. For clarity, the present invention will sometimes be described in the context of digital integrated circuits such as programmable logic device integrated circuits. This is, however, merely illustrative.

Figure 1:
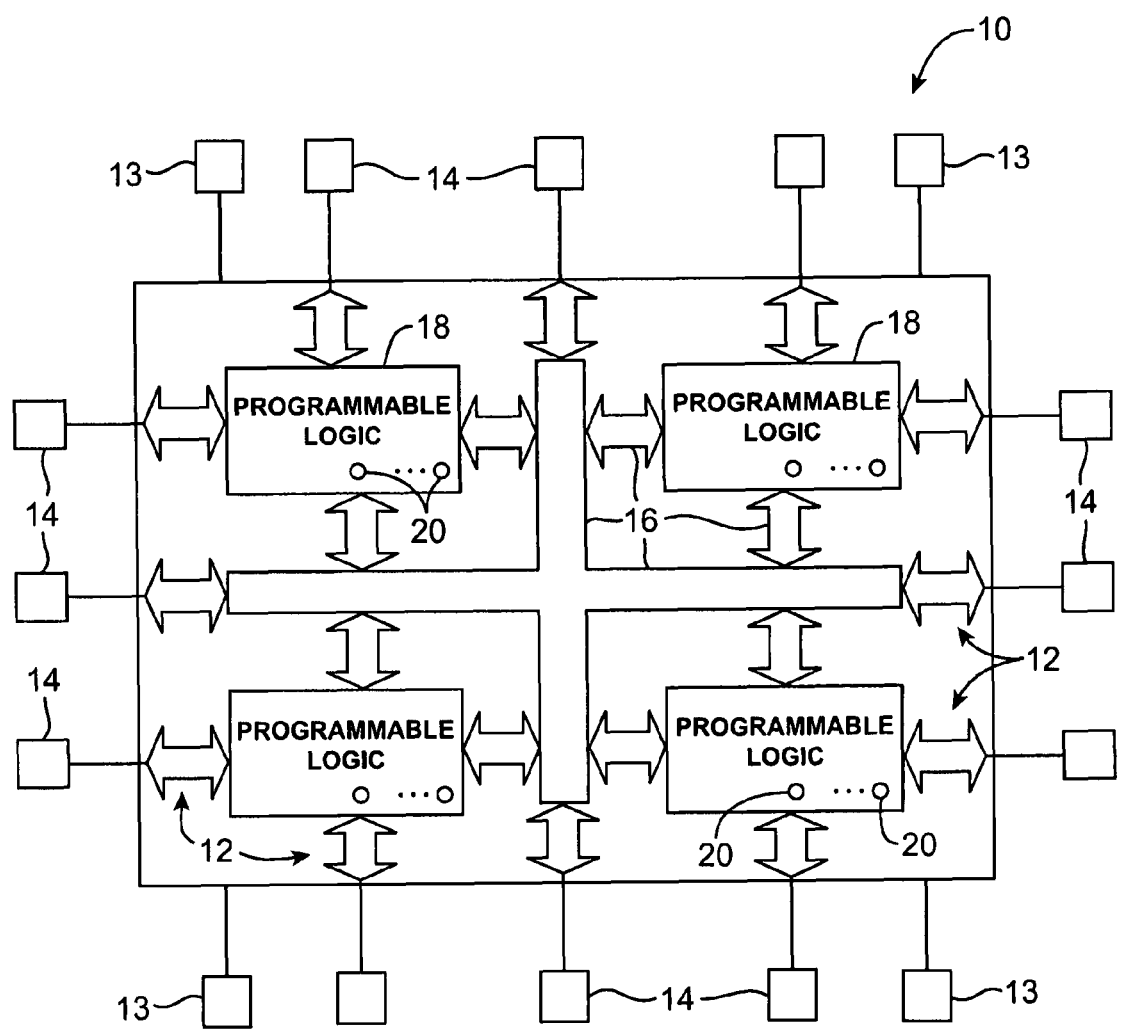
FIG. 1 is a schematic diagram of an illustrative integrated circuit in accordance with an embodiment of the present invention.

An illustrative programmable logic device 10 in accordance with the present invention is shown in FIG. 1.

Programmable logic device 10 may have input/output circuitry 12 for driving signals off of device 10 and for receiving signals from other devices via input/output data pins 14. Power supply pins such as pins 13 may be used to provide power supply signals to device 10. Interconnection resources 16 such as vertical and horizontal conductive lines may be used to route signals on device 10.

Programmable logic device 10 may have core circuitry 18 (sometimes referred to as "core logic"). Core logic 18 may include combinational and sequential logic circuitry. The circuitry of device 10 such as core circuitry 18, interconnection resources 16, and I/O circuitry 12 may include hardwired circuitry and programmable logic that may be customized ("programmed") by a user to perform a desired custom logic function.

Programmable logic device 10 may be based on any suitable programmable technology. With one suitable approach, configuration data (also called programming data) may be loaded into programmable elements using pins 14 and input/output circuitry 12. In the example of FIG. 1, a number of illustrative programmable elements 20 are shown. In general, there are numerous elements 20 on a given device. The programmable elements 20 (also sometimes called configuration bits or programmable function control elements) may each provide a static control output signal that controls the state of an associated logic component in programmable logic device 10.

As an example, the programmable elements 20 may be random-access memory (RAM) cells that are loaded from an external configuration device integrated circuit via pins 14 and input/output circuitry 12. The loaded RAM cells 20 provide static control signals that are applied to the terminals (e.g., gates) of circuit elements (e.g., metal-oxide-semiconductor transistors) in the programmable logic of device 10 to control those elements (e.g., to turn certain transistors on or off) and thereby configure the logic of device 10 so that it performs a desired function. The circuit elements may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include one-time programmable device arrangements such as those based on programmable logic elements made from fuses or antifuses, programmable logic devices in which elements 20 are formed from electrically-programmable read-only-memory (EPROM) or erasable-electrically-programmable read-only-memory (EEPROM) technology, programmable logic devices with programmable elements made from magnetic storage elements, mask-programmed programmable elements, etc.

The circuitry of device 10 may be organized using any suitable architecture. As an example, the logic of programmable logic device 10 may be organized in a series of rows and columns of one or more larger programmable logic regions or areas (sometimes referred to as logic array blocks or LABs) each of which contains multiple smaller logic regions or areas (sometimes referred to as logic elements or LEs). These logic resources may be interconnected by interconnection resources 16 such as associated vertical and horizontal conductors. The interconnection conductors 16 may include global conductive lines that span substantially all of device 10, fractional lines such as half-lines or quarter lines that span a substantial part of device 10, staggered lines of a particular length (e.g., sufficient to interconnect several logic areas), smaller local lines that interconnect certain logic regions with other logic regions in a given area, or any other suitable interconnection resource arrangement. Multiplexers and other suitable circuits may be used to interconnect vertical and horizontal conductors to form various user-selected signal paths throughout device 10. If desired, the logic of device 10 may be arranged in more levels or layers in which multiple large areas are interconnected to form still larger portions of logic. Still other device arrangements may use logic that is not arranged in rows and columns.

The programmable logic of device 10 may be based on look-up tables (LUTs) or any other suitable configurable logic circuits. Logic elements (LEs) and other circuits on device 10 may contain register logic for selectively registering data signals.

It is generally desirable to power the components in core logic 18 at a relatively low voltage (e.g., 1.2 volts or lower as advances in semiconductor processing technology permit). The power supply voltage used to power the circuitry in the core is often referred to as Vccint.

The signals that are driven off of the circuit 10 by input-output circuitry 12 and that are received from external sources by input-output circuitry 12 may have higher voltages (e.g., 3.3 volts as an example). This allows these signals to tolerate the noisier environments that are generally found on chip-to-chip signal busses and provides a proper interface with circuits operating at these higher voltages. As a result, it is often desirable to supply the input-output circuitry 12 of circuit 10 with a power supply voltage in this higher voltage range. This potentially elevated input-output circuit power supply voltage is often referred to as Vccio. Circuit 10 may receive a ground signal Vss (e.g., a 0 volt power supply signal) using one of pins 13. Other power supply voltages may also be used in device 10 if desired.

It is possible to design an integrated circuit that operates exclusively in well-controlled environments in which the power supply voltages such as Vccint and Vccio are applied to the circuit before any data signals are applied to pins 14. However, due to the popularity of hot-swappable peripherals, there is an increasing need for integrated circuits that can tolerate hot socket conditions. Such a circuit will operate properly, even if one or more of its data pins happen to receive live signals before the circuit is fully powered up.

Situations in which one or more data pins receive signals before the core logic is active are often referred to as hotsocket conditions and can be detected using hotsocket detection circuitry. In accordance with the present invention, programmable logic device 10 has circuitry for detecting hotsocket conditions and for preventing circuit damage when a hotsocket condition is detected. An illustrative circuit arrangement that may be used by device 10 is shown in FIG. 2.

Figure 2:
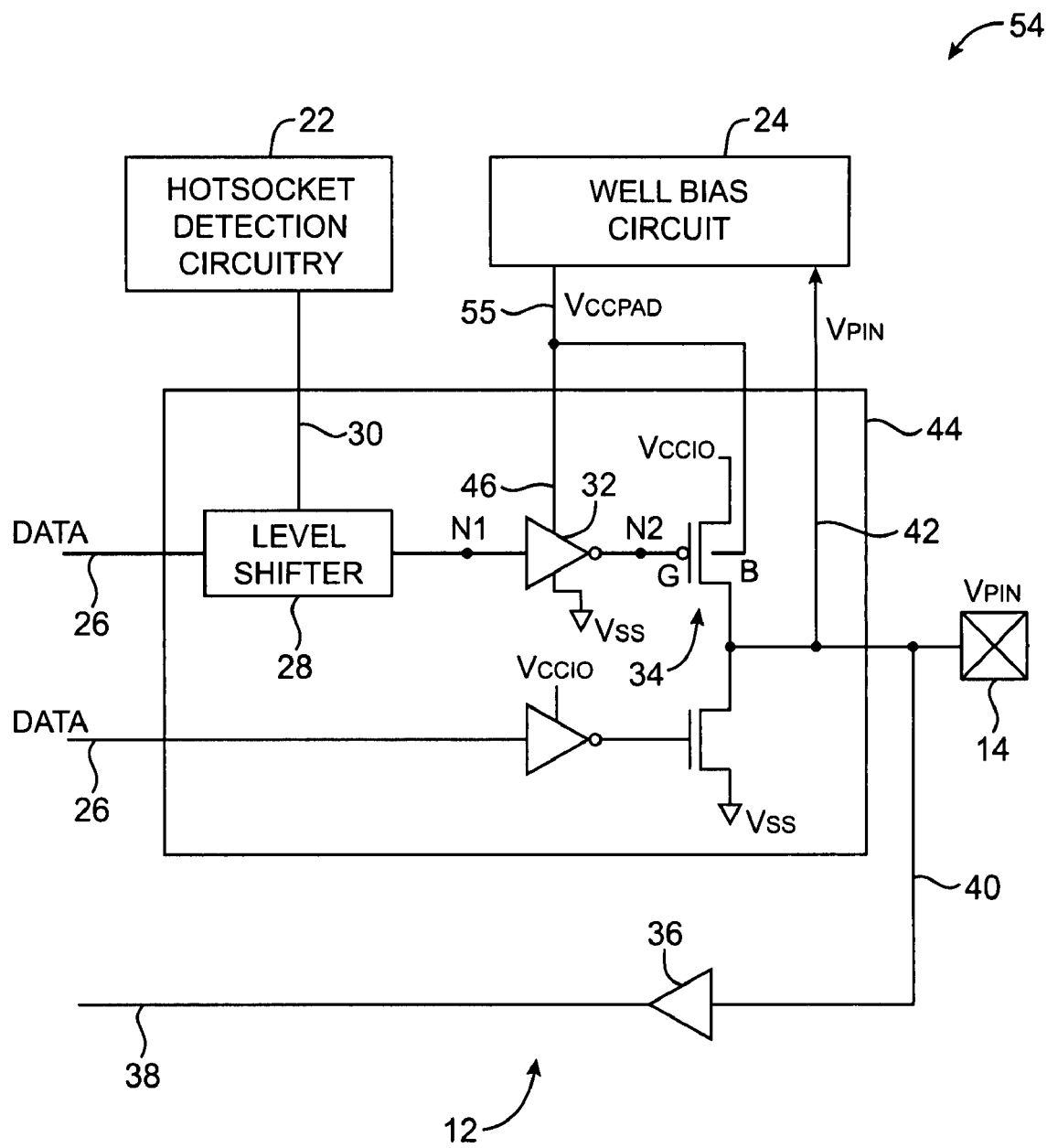
FIG. 2 is a circuit diagram showing how hotsocket detection circuitry may be used to control input-output circuitry in accordance with an embodiment of the present invention.

In the example of FIG. 2, a portion 54 of the circuitry of device 10 in the vicinity of an input-output circuit 12 is shown. Circuitry 54 includes hotsocket detection circuitry 22. Hotsocket detection circuitry 22 generates a control signal at its output that is supplied to level shifter 28 via line 30. The control signal (HOTSOCKET) may have either an enabling state or a disabling state. For example, HOTSOCKET may be low (enabling) when all of the power supply signals on device 10 have reached their desired operating levels and may otherwise be high (disabling). If desired, the polarity of the HOTSOCKET signal may be reversed, so that HOTSOCKET is high when the power supply signals are all valid and may be low when one or more of the power supply voltages are not ready for normal operation. The use of a scheme in which HOTSOCKET is low when the power supply signals are all ready for operation is merely illustrative.

Core logic on device 10 supplies output data signal DATA (e.g., a 0 to Vccint signal) on lines such as lines 26. This data may be transmitted to an external receiver through output buffer 44 and input-output pin 14. Data may also be received using pin 14. Received data may be provided to core logic on device 10 via input path 40, buffer 36, and path 38.

Output buffer 44 is enabled and disabled by the control signal HOTSOCKET that is received on line 30.

If a hotsocket condition is detected, hotsocket detection circuitry 22 may generate a high HOTSOCKET control signal that disables level shifter 28. When level shifter 28 is disabled in this way, node N1 will be low. Inverter 32 will invert the low N1 signal, so that node N2 will be high. The voltage on input-output pin 14 in this example is Vpin. The voltage Vpin is provided to well bias circuit 24 via path 42. Well bias circuit 24 can be used to convert potentially AC (alternating current) data signals into a DC (direct current) power supply voltage Vccpad on line 55. The voltage Vccpad is routed to power supply input 46 of inverter 32. The voltage Vccpad is also routed to the well bias terminal B of transistor 34. Because N1 is low and inverter 32 is powered by voltage Vccpad, the voltage on node N2 is Vccpad, which is typically within one transistor threshold voltage Vt of Vpin. Node N2 is connected to the gate G of p-channel metal-oxide-semiconductor transistor 34, so the high Vccpad voltage on node N2 and the voltage Vccpad on well bias terminal B of transistor 34 turn transistor 34 off to prevent leakage current. The disabling HOTSOCKET signal therefore turns off buffer 44 and prevents signals from being transmitted.

If no hotsocket condition is detected, hotsocket detection circuitry 22 may generate a low HOTSOCKET control signal on line 30 that enables level shifter 28 and output buffer 44. In this situation, transistor 34 is on and signals are transmitted through inverter 32 and transistor 34 to input-output pin 14.

Figure 3:
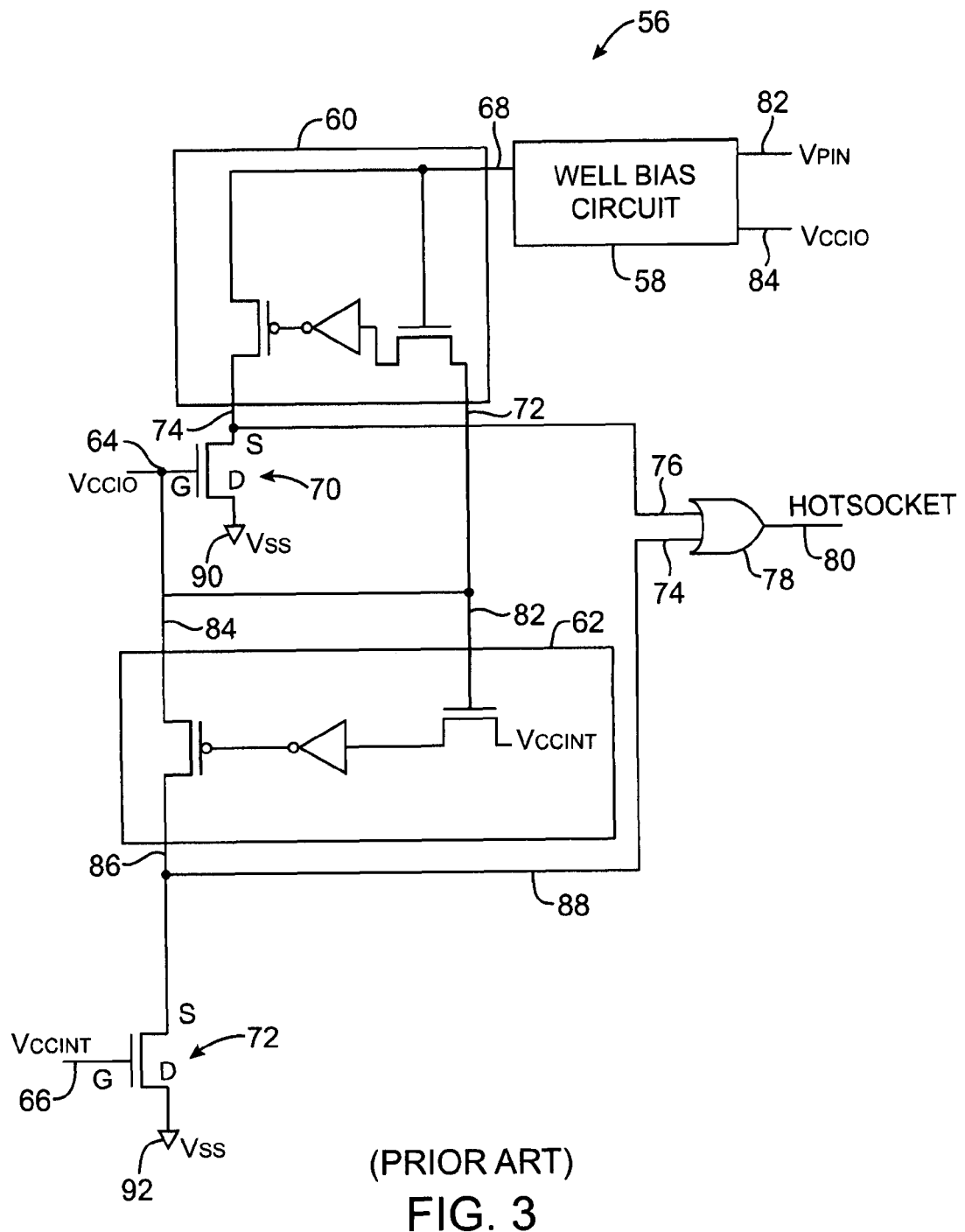
FIG. 3 is a circuit diagram of conventional hotsocket detection circuitry.

Conventional hotsocket detection circuitry of the type that might be used in the circuitry of FIG. 2 is shown in FIG. 3. As shown in FIG. 3, hotsocket detection circuitry 56 receives power supply voltage Vccio at input 64 and receives power supply voltage Vccint at input 66. Hotsocket detection circuitry 56 monitors the magnitudes of the signals on inputs 64 and 66 and produces a corresponding control signal HOTSOCKET on output 80. The value of HOTSOCKET is low when both Vccio and Vccint are at their normal operating levels and is otherwise high.

Hotsocket detection circuitry 56 has a well bias circuit 58. Well bias circuit 58 has an input 82 that receives voltage Vpin from an input-output pin such as pin 14 of FIG. 2. Well bias circuit 58 also has an input 84 that receives voltage Vccio. Well bias circuit 58 produces a signal on output 68 that is equal to the larger of Vpin and Vccio. This signal is received by logic circuit 60. Logic circuit 60 also receives signal Vccio on path 70. Logic signal 60 produces an output signal on output 74. The signal on output 74 is routed to input 76 of OR gate 78. The signal on output 74 is also received by the source terminal S of transistor 70. The drain terminal D of transistor 70 is connected to ground voltage Vss. Gate terminal G of transistor 70 receives the voltage Vccio from input 64.

Logic circuit 62 receives the signal Vccio on lines 84 and 82 and provides an output signal to the source S of transistor 72 on output 86. Transistor 72 has a drain D that is connected to a terminal supplied with ground voltage Vss and has a gate G that receives power supply voltage Vccint from input 66. The output signal on output line 86 is routed to input 74 of OR gate 78 via path 88.

The OR gate 78 performs a logical OR function on the signals on inputs 76 and 74 and produces a corresponding HOTSOCKET signal on output 80. During operation, hotsocket detection circuitry 56 produces a high HOTSOCKET signal whenever either Vccio or Vccint is below its normal operating level and produces a low HOTSOCKET signal when both Vccio and Vccint are at their normal operating levels and are ready for powering circuitry. If, as an example, the signals Vccint and Vccio are both at their normal operating levels, the signals on the gates of transistors 70 and 72 will turn transistors 70 and 72 on. Transistor 70 is stronger than logic circuit 60, so when transistor 70 is on, input 76 of OR gate is pulled to ground voltage Vss at terminal 90. Similarly, transistor 72 is stronger than logic circuit 62, so when transistor 72 is on, input 74 of OR gate 78 is pulled to Vss at terminal 92. With both inputs 76 and 74 low, output 80 of OR gate 78 (the HOTSOCKET signal) is low. If either Vccio or Vccint is not fully powered, transistor 70 or transistor 72 will not be able to pull input 76 or input 74 low. Rather, logic circuit 60 will pull input 76 high or logic circuit 62 will pull input 74 high. When one of the inputs to OR gate 78 is high, the HOTSOCKET signal will be high, indicating that a hotsocket condition exists.

Power-on-reset (POR) circuitry (not shown) receives the signals Vccio and Vccint and generates a corresponding power-on-reset signal POR. The value of POR may, for example, be low when Vccio and Vccint are fully powered and may otherwise be high. Process variations on an integrated circuit may lead to variations in device performance. For example, process variations may lead to variations in transistor threshold voltage that affect the behavior of transistors on the integrated circuit. Conventional hotsocket detection circuitry and power-on-reset circuitry may exhibit performance fluctuations related to process-related threshold voltage variations. To reduce or eliminate these process-induced performance fluctuations, it may be desirable to provide an integrated circuit with process-independent power-on-resent circuitry. Such circuitry may use an accurate voltage reference such as a bandgap voltage reference to produce accurate and stable POR signals that are relatively immune to semiconductor fabrication process variations.

Although the use of a power-on-reset circuit with a bandgap voltage reference may improve power-on-reset performance, stabilizing the power-on-reset circuitry in this way may lead to errors when using conventional hotsocket detection circuitry. During a normal power-up sequence, the signal HOTSOCKET changes to its enable state after the signal POR changes to its enable state. When the signal POR changes to its enable state, core logic is enabled and begins normal operation. Only after the core logic is functioning does the HOTSOCKET change to its enable state to enable input-output circuits such as input-output circuits 12 in FIG. 1. This sequence of operations staggers the current load on the integrated circuit, which helps to prevent circuit damage due to excessive current. This sequence of operation also ensures that the core logic will be functioning properly before output buffers are turned on. If the output buffers were to be turned on first (i.e., if the signal HOTSOCKET were to go low before the signal POR), output buffers that have already been turned on would be presented with signals from core logic during its power up operations. This could lead to damage in the output buffers or damage to other integrated circuits on a system board that are connected to the output buffers.

Consider, as an example, the situation in which a process-invariant POR circuit is formed on the same integrated circuit as conventional hotsocket detection circuitry of the type shown in FIG. 3. The power supply voltage Vccio is fully powered and the power supply signal Vccint is ramping up from Vss (in this example). In this type of situation, process variations may cause a change in transistor threshold voltage that affects how the hotsocket detection circuitry operates. This may disrupt the normal order of signal transitions for the HOTSOCKET and POR signals. Because signal Vccio is fully powered (in this example), the signals HOTSOCKET and POR will both transition from their high (disable) to low (enable) states when power supply voltage Vccint has become fully powered.

There is a threshold (sometimes referred to as a voltage trip point) that is associated with detecting when Vccint has become fully powered. Typically the hotsocket detection circuitry and the power-on-reset circuitry will have different associated threshold levels, to avoid concurrent switching of the input-output circuits that are controlled by the signal HOTSOCKET and the core logic circuits that are controlled by the signal POR. For example, the hotsocket detection circuitry may take its output HOTSOCKET from high to low when Vccint exceeds threshold V2, whereas the power-on-reset circuitry may take its output POR from high to low when Vccint exceeds a threshold V1 that is less than V2.

Figure 4:
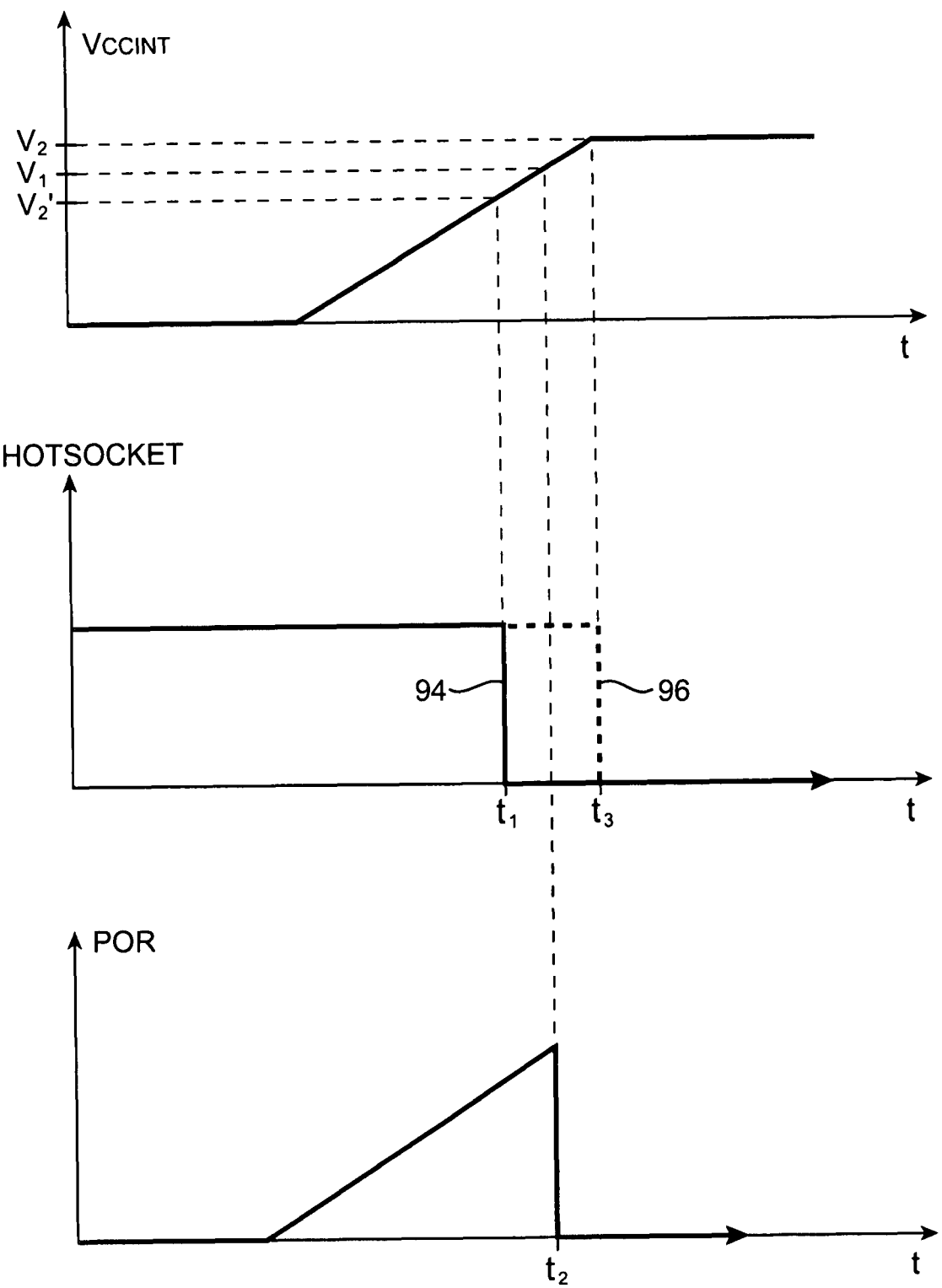
FIG. 4 is a graph showing how a hotsocket signal may change state before a power-on-reset signal in an arrangement in which conventional hotsocket detection circuitry is used with process-independent power-on-reset circuitry.

Due to process variations, the transistors of the hotsocket detection circuit may be fabricated with a threshold voltage that differs from their nominal threshold voltage. This may change the trip point voltage for the hotsocket detection circuitry to a voltage V2' that is lower than its intended value of V2. As shown in the uppermost two traces of FIG. 4, this may cause the signal HOTSOCKET to go low at time t1 (as indicated by solid line falling edge 94), instead of going low at time t3 (as indicated by dotted line falling edge 96). The voltage trip point for the power-on-reset circuitry is V1, so signal POR goes low at time t2, as shown in the lowermost trace of FIG. 4.

In the absence of process variations, the signal HOTSOCKET would go low at t3, after the signal POR goes low at t2, thereby avoid circuit damage. Due to the presence of process variations and the associated shift in the hotsocket trip point voltage from V2 to V2', however, the signal HOTSOCKET goes low at time t1, before the POR signal goes low at t2. The trip point voltage V1 of the power-on-reset circuit does not shift due to the process variations (in this example), because the power-on-reset circuitry contains a stable voltage reference such as a bandgap voltage reference.

As this example demonstrates, the use of conventional hotsocket detection circuitry may lead to undesirable HOTSOCKET and POR sequences, particularly in circuit environments in which process-invariant power-on-reset circuit designs are used.

Figure 5:
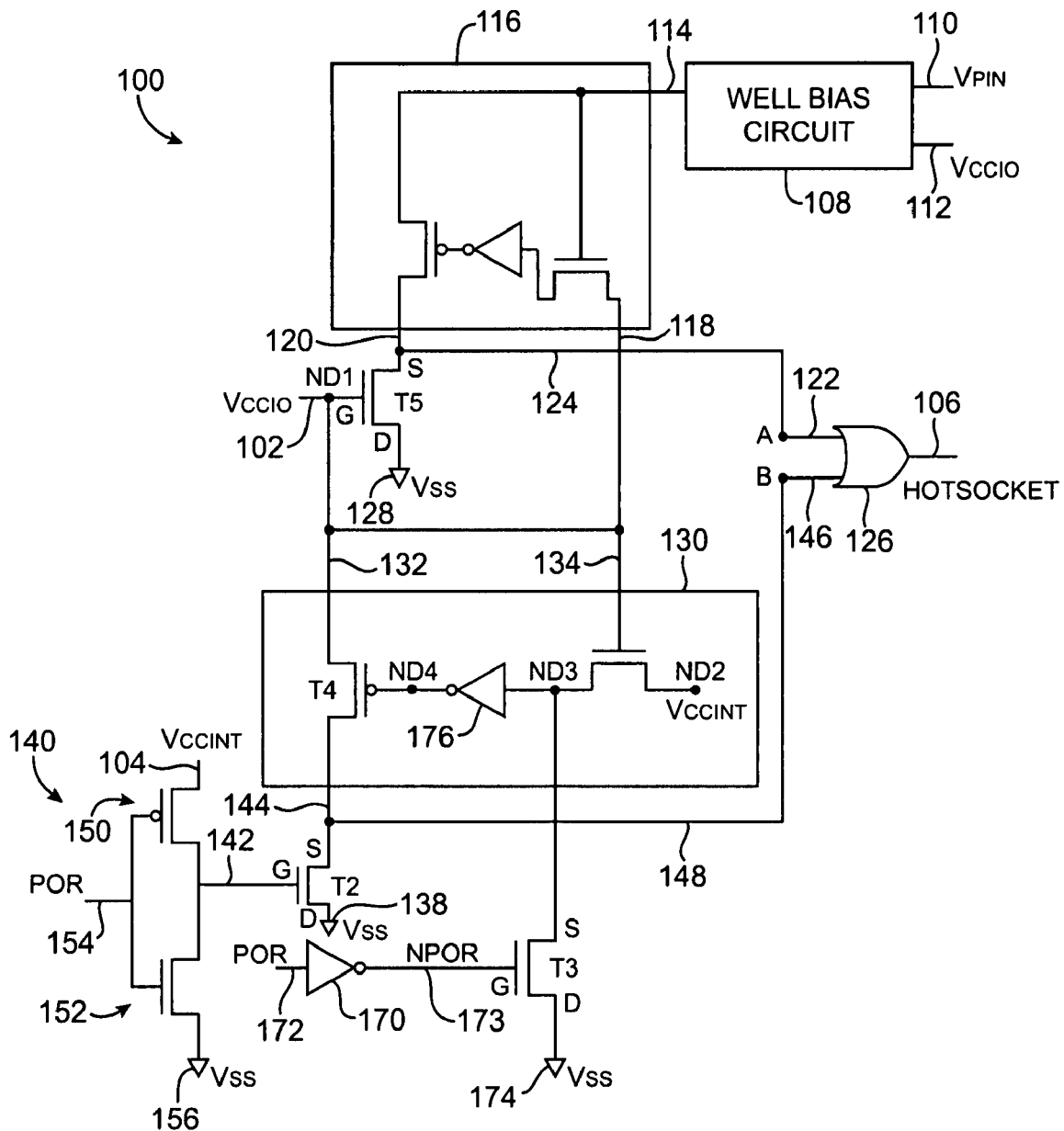
FIG. 5 is a circuit diagram of hotsocket detection circuitry in accordance with an embodiment of the present invention.

Hotsocket detection circuitry in accordance with the present invention is shown in FIG. 5. As shown in FIG. 5, hotsocket detection circuitry 100 receives power supply voltage Vccio at input 102 and receives power supply voltage Vccint at input 104 and node ND2. Hotsocket detection circuitry 100 monitors the magnitudes of the Vccio and Vccint signals and produces a corresponding control signal HOTSOCKET on output 106. The value of HOTSOCKET is low when both Vccio and Vccint are at their normal operating levels. The value of HOTSOCKET is high when either Vccio or Vccint is below its normal operating range and is not ready to be used as a power supply voltage.

Hotsocket detection circuitry 100 may have a well bias circuit 108. Well bias circuit 108 may have an input 110 that receives voltage Vpin from an input-output pin such as pin 14 of FIG. 2. Well bias circuit 108 may also have an input 112 that receives voltage Vccio. Well bias circuit 108 may produce a signal on output 114 that is equal to the larger of Vpin and Vccio. This positive voltage signal may be received by logic circuit 116. Logic circuit 116 may also receive signal Vccio from input 102 and node ND1 via path 118. Logic circuit 116 may produce an output signal on output 120. The signal on output 120 may be routed to input 122 of OR gate 126 via path 124. The signal on output 120 may also be provided to the source terminal S of transistor T5. The drain terminal D of transistor T5 may be connected to ground voltage Vss at ground terminal 128. Gate terminal G of transistor T5 may receive the voltage Vccio from input 102.

Logic circuit 130 may receive the positive voltage signal Vccio on lines 132 and 134 and may provide an output signal on output 144 to the source S of transistor T2. The drain D of transistor T2 may be connected to ground voltage Vss at terminal 138. The gate G of transistor T2 may be connected to output 142 of inverter 140. The output signal on output 144 may be routed to input 146 of OR gate 126 via path 148.

Inverter 140 may be formed from any suitable number of inverter stages. In the example of FIG. 5, inverter 140 is formed from a single inverter stage having p-channel metal-oxide-semiconductor (PMOS) transistor 150 and n-channel metal-oxide-semiconductor (PMOS) transistor 152. Ground power supply voltage Vss may be connected to ground terminal 156. Transistors 150 and 152 may be connected in series between power supply terminal 104 and ground power supply terminal 156. A power-on-reset signal POR may be provided to inverter input 154 from a power-on-reset circuit. Inverter 140 serves as a delay circuit that adds a time delay to the signal POR. Delaying the signal POR with respect to the signal HOTSOCKET, helps to ensure that undesirable conditions of the type shown in FIG. 4 in which HOTSOCKET goes low before POR will not been encountered. A delayed (and inverted) version of POR is provided on inverter output 142. The inverted version of POR has a digital low value when the input to inverter 140 is high and has a digital high value when the input to inverter 140 is low.

The OR gate 126 may perform a logical OR function on the signals on inputs 122 and 146 to produce a corresponding HOTSOCKET signal on output 106. During operation, hotsocket detection circuitry 100 can produce a high HOTSOCKET signal whenever either Vccio or Vccint is below its normal operating level and can produce a low HOTSOCKET signal when both Vccio and Vccint are at their normal operating levels and are ready for powering circuitry on integrated circuit 10.

If, as an example, the signals Vccint and Vccio are both at their normal operating levels, the signals on the gates of transistors T5 and T2 will turn transistors T5 and T2 on. Transistor T5 is stronger than logic circuit 116, so when transistor T5 is on, output 120 and input 122 of OR gate will be pulled to ground voltage Vss at terminal 128. Similarly, transistor T2 is stronger than logic circuit 130, so when transistor T2 is on, source S of transistor T2 and input 146 of OR gate 126 will be pulled to Vss at terminal 138. With both inputs 122 and 146 are low, output 80 of OR gate 78 (the HOTSOCKET signal) is low.

If either Vccio or Vccint is not fully powered, transistor T5 or transistor T2 will not be able to pull input 122 or input 146 low. For example, if Vccio is not fully powered, the voltage on node ND1 will be insufficient to turn on transistor T5. In this situation, logic circuit 116 may pull input 122 high. If Vccint is not fully powered, output 142 of inverter 140 will be insufficient to turn on transistor T2. With transistor T2 off, logic circuit 130 will pull input 146 high. With input 122 or input 146 high or with both inputs 122 and 146 high, the HOTSOCKET signal at output 106 of OR gate 126 will be low, indicating that a hotsocket condition is present.

The output of inverter 140 will only become sufficiently high to turn transistor T2 on and pull input 146 low when both Vccint is fully powered and the POR signal on input 154 has gone low. When signal POR is high, inverter 140 will invert the high POR signal to produce a low output signal on output 142. Output 142 will also be low if Vccint is low, regardless of the state of the POR signal on input 154.

Figure 6:
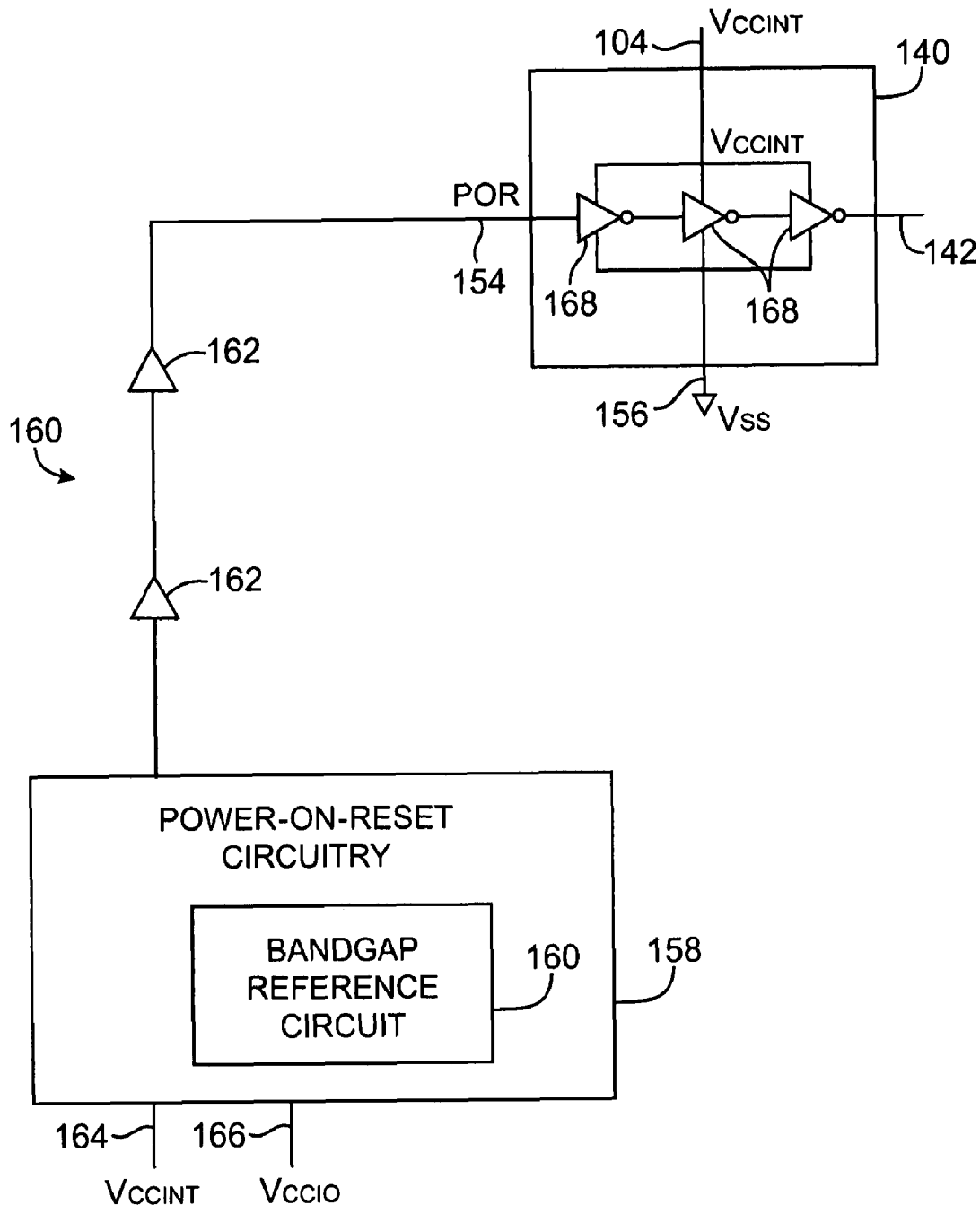
FIG. 6 is a circuit diagram of an illustrative power-on-reset circuit and associated delay circuitry for use with hotsocket detector circuitry in accordance with an embodiment of the present invention.

The signal POR may be produced by power-on-reset circuitry such as the power-on-reset circuitry 158 of FIG. 6. As shown in FIG. 6, power-on-reset circuitry 158 may use a process-invariant arrangement, so that the behavior of the power-on-reset circuit is not significantly influenced by process variations. In the example of FIG. 6, power-on-reset circuitry 158 contains a stable voltage reference such as a bandgap voltage reference circuit 160. Bandgap reference circuit 160 may produce an accurate reference voltage that power-on-reset circuitry may use to establish a power-on-reset trip point voltage V1. Power-on-reset circuitry 158 may monitor power supply voltages Vccint and Vccio on lines 164 and 166 and may produce a corresponding power-on-reset signal POR on its output. The signal POR may be conveyed to the input 154 of inverter 140 over a POR signal distribution path such as path 160. There may be one or more noninverting buffers such as buffers 162 interposed in path 160 to help strengthen signal POR.

Inverter 140 may have one or more stages such as stages 168. Each inverter stage contributes an additional delay to inverter 140. Stages 168 may be connected in series between input 154 and output 142. In arrangements in which there are an odd number of inverter stages in inverter 140, the signal POR will be inverted between input 154 and output 142. For example, a low POR signal that has been inverted three times by three inverter stages 168 will be presented as a high signal at output 142. This high signal can be used to turn on transistor T2, as described in connection with FIG. 5.

There are delays associated with the conductive line in path 160, the buffers 162 in path 160, and each inverter stage in inverter 140. The delays of these components, and particularly the delay associated with inverter 140, delay the signal POR that is produced by power-on-reset circuitry 158, so that signal HOTSOCKET will go low at a delay time td after signal POR goes low.

Figure 7:
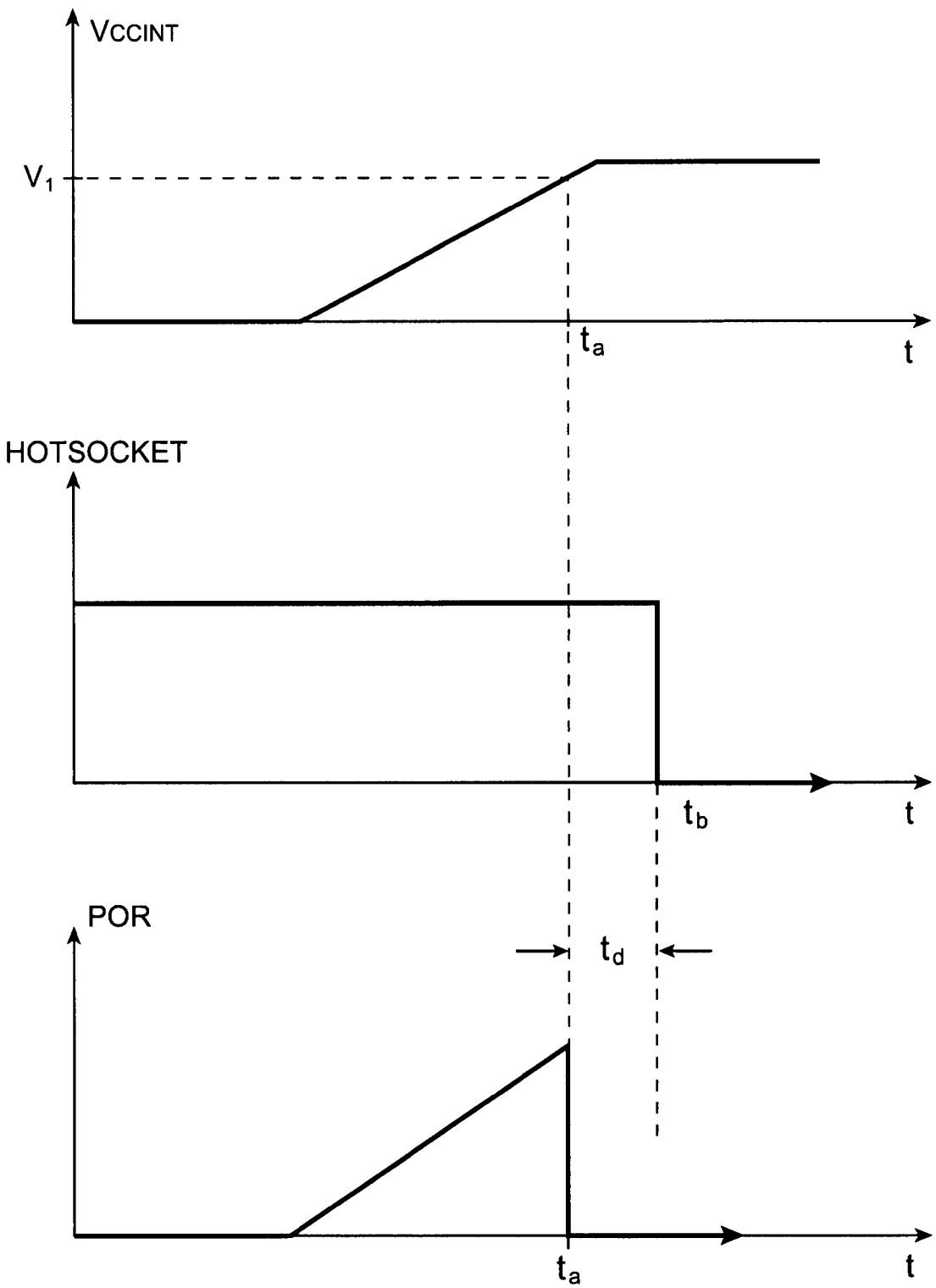
FIG. 7 is a graph showing how hotsocket detection circuitry of the type shown in FIG. 5 may be used to generate a hotsocket signal that changes state after a power-on-reset signal from process-independent power-on-reset circuitry changes state in accordance with an embodiment of the present invention.

Consider the illustrative situation of FIG. 7. In this example, power supply voltage Vccio has already become fully powered, but power supply voltage Vccint is still in the process of ramping up. Power-on-reset circuitry 158 (FIG. 6). produces a POR signal that goes low at time ta, when Vccint exceeds trip point voltage V1.

As shown in the uppermost trace of FIG. 7, Vccint is not fully powered at times before ta. As a result, transistor T2 in hotsocket detection circuitry 100 (FIG. 5) is off and logic circuit 130 is pulling OR gate input 146 high. This holds signal HOTSOCKET high, as shown in the middle trace of FIG. 7. At time ta, both Vccio and Vccint are fully powered, so POR goes low, as shown in the lowermost trace of FIG. 7. The voltage Vccint on terminal 104 of inverter 140 has a sufficient magnitude to power the transistors of inverter 140. After a delay time td, an inverted (high) version of the signal POR is presented at inverter output 142 and gate G of transistor T2. This high signal turns on transistor T2, which pulls input 146 low. As shown in the middle trace of FIG. 7, this makes signal HOTSOCKET go low at time tb.

The signal HOTSOCKET that is produced at the output 106 of hotsocket detection circuitry 100 of FIG. 5 may be used to enable and disable input-output circuitry such as input-output circuits 12 on programmable logic device 10 of FIG. 1. The signal POR that is produced at the output of power-on-reset circuitry 158 of FIG. 6 may be used to enable and disable core logic 18 on programmable logic device 10. Due to the use of an inverter or other suitable delay circuitry 140 in hotsocket detection circuitry 100, the signal HOTSOCKET is ensured of exhibiting its transition from high to low after the signal POR exhibits its transition from high to low. As a result, the input-output circuitry 12 on device 10 will only be enabled after the core logic has been enabled, thereby avoiding undesirable POR and HOTSOCKET signal sequences of the type shown in FIG. 4.

The operation of hotsocket circuitry 100 in response to various power supply and input-output pin voltages is shown in a table in FIG. 8. The POR signal is assumed to be low. The level of power supply voltage Vccio at inputs 102 and 112 to hotsocket detection circuitry 100 is shown in the first column of the table. The level of power supply voltage Vccint at input 104 to hotsocket detection circuitry 100 is shown in the second column of the table. The voltages Vccio and Vccint are said to be "ready" when they are fully powered and are said to be "not ready" when they at a low voltage (e.g., when ramping up) and are not fully powered.

The third column of the table in FIG. 8 shows the input-output pin voltage Vpin on input 110 of hotsocket detection circuitry 100. The symbol "X" denotes a don't care situation in which the state of Vpin is immaterial to the resulting value of HOTSOCKET. The rightmost three columns of the table show the digital values of nodes A and B in FIG. 5 and the output signal HOTSOCKET.

Each row in the table of FIG. 8 relates to a different potential scenario.

For example, consider the situation in which both Vccio and Vccint are fully powered. In this situation, the transistors T5 and T2 are on and nodes A and B are pulled low, regardless of the state of Vpin. With both A and B low, the signal HOTSOCKET at the output 106 of OR gate 126 will be low (enabling).

The second row of the table of FIG. 8 is associated with the situation in which Vccio is not ready, Vccint is ready, and Vpin is low. In this situation, the output of well bias circuit 108 will be Vccio. Because Vccio is not ready, T5 is off and is unable to overpower logic circuit 116. As a result, logic circuit 116 pulls node A high. Vccint is ready, so T2 is on and overpowers logic circuit 130, pulling node B low. With node A high and node B low, signal HOTSOCKET is high at Vccio (the highest voltage available in the system). The high signal HOTSOCKET may be used as a disable signal for input-output buffer circuitry such as output buffer 44 of FIG. 2.

The third row of the table is associated with the situation in which Vccio is ready, Vccint is not ready, and Vpin is either high or low. With Vccio ready, transistor T5 is on and node A is pulled to 0. Vccint is not ready, so transistor T2 is off and logic circuit 130 pulls node B high. With node A low and node B high, signal HOTSOCKET is high.

The fourth row of the table is associated with the situation in which both Vccio and Vccint are not ready. Because neither power supply voltage is ready, the system is not powered and no HOTSOCKET signal is generated.

The fifth row of the table is associated with the situation in which Vccio is not ready, Vccint is ready, and Vpin is greater than Vccio. In this situation, the output 114 of well bias circuit 108 is high at Vpin. Vccio is not ready, so transistor T5 is off and logic circuit 116 pulls node A high. Vccint is ready, so transistor T2 is on and node B is pulled low. With node A high and node B low, signal HOTSOCKET is high at Vpin.

The sixth row of the table is associated with the situation in which Vccio is not ready, Vccint is ready, and Vpin is less than Vccio. In this situation, the output 114 of well bias circuit 108 is at Vccio. Vccio is not ready, so transistor T5 is off and logic circuit 116 pulls node A high. Vccint is ready, so transistor T2 is on and node B is pulled low. With node A high and node B low, signal HOTSOCKET is high at Vccio.

If desired, hotsocket detection circuitry 100 of FIG. 5 may have an optional disable transistor T3. Transistor T3 may be used to help node B go low and thereby speed up the operation of circuitry 100.

Consider the situation in which Vccio is ready and Vccint is in the process of ramping up. In this situation, node ND1 is at the full Vccio value. Voltage Vccint is received at node ND2 in logic circuit 130. When voltage Vccint becomes sufficiently high, power-on-reset circuitry 158 (FIG. 6) will take signal POR on line 154 low. When POR goes low, gate G of transistor T2 is pulled high at the output of inverter 140, turning on transistor T2. When transistor T2 is turned on, output 144 of logic circuit 130 is connected to ground terminal 138 and transistor T2 starts to pull output 144 to ground voltage Vss.

Hotsocket detection circuitry 100 may have an inverter 170. Inverter 170 may receive signal POR at input 172 and may produce a corresponding inverted version of signal POR (i.e., signal NPOR) at its output 173. When signal POR goes low, signal NPOR goes high. The signal NPOR is provided to the gate G of transistor T3. Transistor T3 has its source S connected to node ND3 and its drain D connected to ground terminal 174. When NPOR goes high, transistor T3 turns on and pulls node ND3 low to Vss. Inverter 176 inverts the low signal on node ND3, so that node ND4 is taken high. This turns off transistor T4, so that transistor T2 no longer needs to overpower transistor T4 to pull node B low. By disabling transistor T4 in this situation, the disable transistor T3 helps to speed up the edge of the NODE B signal.

The foregoing is merely illustrative of the principles of this invention and various modifications can be made by those skilled in the art without departing from the scope and spirit of the invention.

What is claimed is:

1. Hotsocket detection circuitry on an integrated circuit, comprising:
    a logic gate having first and second inputs and an output, wherein the logic gate produces a hotsocket signal at the output that is indicative of whether the integrated circuit is in a hotsocket condition;
    a first transistor having a first gate that receives a first power supply signal;
    an inverter that is powered by a second power supply voltage, that receives a power-on-reset signal, and that produces a corresponding inverter output signal; and
    a second transistor having a gate that receives the inverter output signal, wherein the first transistor is connected to the first input, wherein the second transistor is connected to the second input, and wherein the second transistor has a terminal that is connected to a first ground terminal at a ground voltage.

2. The hotsocket detection circuitry defined in claim 1 further comprising:
    a logic circuit having an output that is connected to the first input, wherein the first transistor is connected between the first input and a second ground terminal at the ground voltage, so that the output of the logic circuit is pulled to the ground voltage when the first transistor is turned on by the first power supply signal.

3. The hotsocket detection circuitry defined in claim 1 further comprising:
    a logic circuit having an output that is connected to the first input and having an input that is connected to a source of positive voltage, wherein the first transistor is connected between the first input and a second ground terminal at the ground voltage, wherein the logic circuit holds the output of the logic circuit at the positive voltage when the first transistor is not fully turned on, and wherein the output of the logic circuit is pulled to the ground voltage when the first transistor is turned on by the first power supply signal.

4. The hotsocket detection circuitry defined in claim 1 further comprising:
    a logic circuit having an output that is connected to the first input and having an input that is connected to a source of positive voltage, wherein the first transistor is connected between the first input and a second ground terminal at the ground voltage, wherein the logic circuit holds the output of the logic circuit at the positive voltage when the first transistor is not fully turned on, wherein the output of the logic circuit is pulled to the ground voltage when the first transistor is turned on by the first power supply signal, and wherein the logic gate comprises an OR gate.

5. The hotsocket detection circuitry defined in claim 1 further comprising:
    a logic circuit having an output that is connected to the second input, wherein the second transistor is connected between the second input and the first ground terminal at the ground voltage and wherein the output of the logic circuit is pulled to the ground voltage by the second transistor when the second transistor is turned on.

6. The hotsocket detection circuitry defined in claim 1 further comprising:
    a logic circuit having an output that is connected to the second input, wherein the second transistor is connected between the second input and the first ground terminal at the ground voltage, wherein the logic circuit holds the output of the logic circuit at a positive voltage when the second transistor is not fully turned on, and wherein the output of the logic circuit is pulled to the ground voltage when the second transistor is turned on by the inverter output signal.

7. The hotsocket detection circuitry defined in claim 1 further comprising:
    a first logic circuit having an output that is connected to the first input, wherein the first transistor is connected between the first input and a second ground terminal at the ground voltage, so that the output of the first logic circuit is pulled to the ground voltage when the first transistor is turned on by the first power supply signal; and a second logic circuit having an output that is connected to the second input, wherein the second transistor is connected between the second input and the first ground terminal at the ground voltage and wherein the output of the second logic circuit is pulled to the ground voltage by the second transistor when the second transistor is turned on.

8. The hotsocket detection circuitry defined in claim 1 further comprising:

a first logic circuit having an output that is connected to the first input and having an input that is connected to a source of a first positive voltage, wherein the first transistor is connected between the first input and a second ground terminal at the ground voltage, wherein the first logic circuit holds the output of the first logic circuit at the positive voltage when the first transistor is not fully turned on, wherein the output of the first logic circuit is pulled to the ground voltage when the first transistor is turned on by the first power supply signal, and wherein the logic gate comprises an OR gate; and a second logic circuit having an output that is connected to the second input, wherein the second transistor is connected between the second input and the first ground terminal at the ground voltage, wherein the second logic circuit holds the output of the second logic circuit at a second positive voltage when the second transistor is not fully turned on, and wherein the output of the second logic circuit is pulled to the ground voltage when the second transistor is turned on by the inverter output signal.

9. The hotsocket detection circuitry defined in claim 1 wherein the inverter comprises at least three inverter stages each of which includes a respective p-channel metal-oxide-semiconductor transistor and a respective n-channel metal-oxide-semiconductor transistor.

10. The hotsocket detection circuitry defined in claim 1 further comprising:

a logic circuit having an output that is connected to the second input, wherein the second transistor is connected between the second input and the first ground terminal at the ground voltage, wherein the output of the logic circuit is pulled to the ground voltage by the second transistor when the second transistor is turned on, wherein the logic circuit comprises a third transistor connected to the output of the logic circuit, wherein the third transistor has a gate, wherein the logic circuit comprises a logic circuit inverter having an input and an output, wherein the output of the logic circuit inverter is connected to the gate of the third transistor; and a fourth transistor that is connected between the input of the logic circuit inverter and a second ground terminal at the ground voltage, wherein the fourth transistor has a gate that receives an inverted version of the power-on-reset signal.

11. A programmable logic device integrated circuit comprising:

programmable memory elements;
programmable logic that is configured using configuration data loaded into the programmable memory elements;
input-output pins including data pins and power pins; and
hotsocket detection circuitry that monitors signals from the data pins and power pins and that produces a corresponding hotsocket signal that is indicative of whether the integrated circuit is in a hotsocket condition, wherein the hotsocket detection circuitry comprises:

a logic gate having first and second inputs and an output, wherein the logic gate produces the hotsocket signal at the output;

a first transistor having a first gate that receives a first power supply signal from one of the power pins;

a delay circuit that is powered by a second power supply signal from one of the power pins, that receives a power-on-reset signal, and that produces a corresponding delay circuit output signal; and a second transistor having a gate that receives the delay circuit output signal, wherein the first transistor is connected to the first input and wherein the second transistor is connected to the second input; and power-on-reset circuitry that provides the power-on-reset signal to the delay circuit.

12. The programmable logic device integrated circuit defined in claim 11 wherein the delay circuit comprises an inverter having at least one stage formed from a p-channel metal-oxide-semiconductor transistor and an n-channel metal-oxide-semiconductor transistor that are powered by the second power supply signal.

13. The programmable logic device integrated circuit defined in claim 11 wherein the delay circuit comprises an inverter having at least first, second, and third inverter stages connected in series, wherein the first inverter stage receives the power-on-reset signal, and wherein the third inverter stage provides a delayed version of the power-on-reset signal to the gate of the second transistor as the delay circuit output signal.

14. The programmable logic device integrated circuit defined in claim 11 further comprising:

a logic circuit having an output that is connected to the second input of the logic gate, wherein the second transistor is connected between the second input of the logic gate and a terminal at a ground voltage and wherein the output of the logic circuit is pulled to the ground voltage by the second transistor when the second transistor is turned on.

15. The programmable logic device integrated circuit defined in claim 11 wherein the power-on-reset circuitry includes a bandgap voltage reference.

16. Hotsocket detection circuitry on an integrated circuit that monitors signals from data pins and power pins and that produces a corresponding hotsocket signal that is indicative of whether the integrated circuit is in a hotsocket condition, wherein the integrated circuit includes power-on-reset circuitry that produces a power-on-reset signal indicative of whether power supply voltages received from the power pins are ready for powering circuitry in the integrated circuit, wherein the hotsocket detection circuitry comprises:

a logic OR gate having first and second inputs and an output, wherein the logic OR gate produces the hotsocket signal at the output;

a first transistor having a first gate that receives a first power supply signal;

a delay circuit that is powered by a second power supply signal, wherein the delay circuit has an input that receives the power-on-reset signal from the power-on-reset circuitry and that has an output at which a corresponding delayed version of the power-on-reset signal is provided; and a second transistor having a gate that receives the delayed version of the power-on-reset signal, wherein the first transistor is connected to the first input and wherein the second transistor is connected to the second input.

17. The hotsocket detection circuitry defined in claim 16 further comprising:
  a first logic circuit having an output that is connected to the first input, wherein the first transistor is connected between the first input and a first terminal at a ground voltage, so that the first input is pulled to the ground voltage when the first transistor is turned on by the first power supply signal; and
  a second logic circuit having an output that is connected to the second input, wherein the second transistor is connected between the second input and a second terminal at the ground voltage and wherein the second input is pulled to the ground voltage by the second transistor when the second transistor is turned on.

18. The hotsocket detection circuitry defined in claim 16 further comprising:
  circuitry that receives the first power supply signal and a voltage from one of the data pins and the provides a corresponding output voltage;
  a first logic circuit that receives the output voltage from the circuitry, wherein the first logic circuit has an output that is connected to the first input of the logic OR gate and wherein the first transistor is connected between the first input and a first terminal at a ground voltage, so that the first input of the logic OR gate is pulled to the ground voltage when the first transistor is turned on by the first power supply signal; and
  a second logic circuit having an output that is connected to the second input of the logic OR gate, wherein the second transistor is connected between the second input of the logic OR gate and a second terminal at the ground voltage and wherein the second input of the logic OR gate is pulled to the ground voltage by the second transistor when the second power supply signal is ready for operation and the inverted version of the power-on-reset signal has a digital high value.

19. The hotsocket detection circuitry defined in claim 16 further comprising:
  a logic circuit having an output that is connected to the second input of the logic OR gate, wherein the second transistor is connected between the second input of the logic OR gate and a terminal at a ground voltage and wherein the second input of the logic OR gate is pulled to the ground voltage by the second transistor when the second power supply signal is ready for operation and the inverted version of the power-on-reset signal has a digital high value.

20. The hotsocket detection circuitry defined in claim 16 further comprising:
  a logic circuit having an output that is connected to the second input of the logic OR gate, wherein the second transistor is connected between the second input of the logic OR gate and a first terminal at a ground voltage, wherein the output of the logic circuit is pulled to the ground voltage by the second transistor when the second transistor is turned on, wherein the logic circuit comprises a third transistor connected the output of the logic circuit, wherein the third transistor has a gate, wherein the logic circuit comprises a logic circuit inverter having an input and an output, wherein the output of the logic circuit inverter is connected to the gate of the third transistor; and
  a fourth transistor that is connected between the input of the logic circuit inverter and a second terminal at the ground voltage, wherein the fourth transistor has a gate that receives an inverted version of the power-on-reset signal.

\* \* \* \* \*